(12) United States Patent
Allen et al.

(10) Patent No.: US 9,466,674 B2
(45) Date of Patent: *Oct. 11, 2016

(54) SEMICONDUCTOR DEVICES WITH NON-IMPLANTED BARRIER REGIONS AND METHODS OF FABRICATING SAME

(75) Inventors: Scott Thomas Allen, Apex, NC (US); Qingchun Zhang, Cary, NC (US)

(73) Assignee: Cree, Inc., Durham, NC (US)

( * ) Notice: Subject to any disclaimer, the term of this patent is extended or adjusted under 35 U.S.C. 154(b) by 655 days.

This patent is subject to a terminal disclaimer.

(21) Appl. No.: 13/605,324

(22) Filed: Sep. 6, 2012

(65) Prior Publication Data

US 2013/0032809 A1    Feb. 7, 2013

Related U.S. Application Data

(63) Continuation-in-part of application No. 12/719,412, filed on Mar. 8, 2010, now Pat. No. 9,117,739.

(60) Provisional application No. 61/532,762, filed on Sep. 9, 2011.

(51) Int. Cl.
| | |
|---|---|
| *H01L 29/16* | (2006.01) |
| *H01L 29/47* | (2006.01) |
| *H01L 29/66* | (2006.01) |
| *H01L 29/861* | (2006.01) |
| *H01L 29/872* | (2006.01) |

(Continued)

(52) U.S. Cl.
CPC ....... *H01L 29/1608* (2013.01); *H01L 21/8213* (2013.01); *H01L 29/0619* (2013.01); *H01L 29/165* (2013.01); *H01L 29/47* (2013.01); *H01L 29/66068* (2013.01); *H01L 29/861* (2013.01); *H01L 29/872* (2013.01)

(58) Field of Classification Search
CPC ............. H01L 29/861; H01L 29/8611; H01L 29/8613; H01L 29/872; H01L 29/1608; H01L 29/165

See application file for complete search history.

(56) References Cited

U.S. PATENT DOCUMENTS

| | | |
|---|---|---|
| 6,995,411 B2 | 2/2006 | Yaung et al. |
| 7,183,575 B2 * | 2/2007 | Shimoida et al. ............. 257/77 |

(Continued)

FOREIGN PATENT DOCUMENTS

| | | |
|---|---|---|
| EP | 1 845 581 A2 | 10/2007 |
| JP | 2003318389 A | 11/2003 |
| JP | 2007305964 A | 11/2007 |

OTHER PUBLICATIONS

Torvik et al., "Electrical characterization of GaN/SiC n-p heterojunction diodes", 1998, Applied Physics Letters, 72, 1371, pp. 1371-1373.*

(Continued)

*Primary Examiner* — William F Kraig
*Assistant Examiner* — Sun M Kim
(74) *Attorney, Agent, or Firm* — Myers Bigel & Sibley, P.A.

(57) ABSTRACT

An electronic device includes a silicon carbide layer including an n-type drift region therein, a contact forming a Schottky junction with the drift region, and a p-type junction barrier region on the silicon carbide layer. The p-type junction barrier region includes a p-type polysilicon region forming a P-N heterojunction with the drift region, and the p-type junction barrier region is electrically connected to the contact.

25 Claims, 12 Drawing Sheets

(51) Int. Cl.
*H01L 29/165* (2006.01)
*H01L 21/82* (2006.01)
*H01L 29/06* (2006.01)

(56) References Cited

U.S. PATENT DOCUMENTS

| | | | |
|---|---|---|---|
| 7,186,609 B2* | 3/2007 | Korec et al. | 438/221 |
| 7,781,786 B2* | 8/2010 | Hayashi et al. | 257/94 |
| 2002/0125541 A1 | 9/2002 | Korec et al. | |
| 2007/0235745 A1 | 10/2007 | Hayashi et al. | |
| 2008/0029838 A1* | 2/2008 | Zhang et al. | 257/475 |
| 2009/0230393 A1 | 9/2009 | Miyoshi et al. | |
| 2009/0289262 A1 | 11/2009 | Zhang et al. | |
| 2010/0308337 A1 | 12/2010 | Sriram et al. | |
| 2010/0320476 A1 | 12/2010 | Cheng et al. | |
| 2011/0215338 A1 | 9/2011 | Zhang | |

OTHER PUBLICATIONS

Notification Concerning Transmittal of International Preliminary Report on Patentability, Application No. PCT/US2012/053965, Date of Mailing: Mar. 20, 2014, 7 pages.

International Search Report Corresponding to International Application No. PCT/US2012/053965; Date of Mailing: Nov. 23, 2012; 9 Pages.

Henning et al. "Electrical Characteristics of Rectifying Polycrystalline Silicon/Silicon Carbide Heterojynctions" *Journal of Electronic Materials* 27(4)296-299 (1998).

Office Action corresponding to Japanese Application No. 2014-529851, Mailing Date: Feb. 23, 2015, including English translation (7 pages).

Extended European Search Report corresponding to European Application No. 12830318.7, Mailing Date: Mar. 23, 2015 (6 pages).

Office Action corresponding to Japanese Application No. 2014-529851, Mailing Date: Mar. 22, 2016, including English translation (7 pages).

* cited by examiner

US 9,466,674 B2

SEMICONDUCTOR DEVICES WITH NON-IMPLANTED BARRIER REGIONS AND METHODS OF FABRICATING SAME

RELATED APPLICATIONS

The present application claims the benefit of and priority to U.S. Provisional Patent Application No. 61/532,762, filed Sep. 9, 2011, entitled "Semiconductor Devices With Non-Implanted Barrier Regions And Methods Of Fabricating Same," the disclosure of which is hereby incorporated herein by reference in its entirety. The present application is a continuation in part of U.S. patent application Ser. No. 12/719,412, filed Mar. 8, 2010, now U.S. Pat. No. 9,117,739 entitled "Semiconductor Devices with Heterojunction Barrier Regions and Methods of Fabricating Same", the disclosure of which is hereby incorporated herein by reference in its entirety.

TECHNICAL FIELD

The present invention relates to semiconductor devices and the fabrication of semiconductor devices and more particularly, to Junction Barrier Schottky (JBS) diodes, and the fabrication of such diodes.

BACKGROUND

High voltage silicon carbide (SiC) Schottky diodes, which may have voltage blocking ratings between, for example, about 600V and about 2.5 kV, are expected to compete with silicon PIN diodes having similar voltage ratings. Such diodes may handle as much as about 100 amps or more of forward current, depending on their active area design. High voltage Schottky diodes have a number of important applications, particularly in the field of power conditioning, distribution and control.

An important characteristic of a SiC Schottky diode in such applications is its switching speed. Silicon-based PIN devices typically exhibit relatively poor switching speeds. A silicon PIN diode may have a maximum switching speed of approximately 20 kHz, depending on its voltage rating. In contrast, silicon carbide-based Schottky devices are theoretically capable of much higher switching speeds, for example, in excess of about 100 times better than silicon. In addition, silicon carbide devices may be capable of handling a higher current density than silicon devices.

A conventional SiC Schottky diode structure has an n-type SiC substrate on which an n− epitaxial layer, which functions as a drift region, is formed. The device typically includes a Schottky contact formed directly on the n− layer. A junction termination region, such as a guard ring and/or p-type JTE (junction termination extension) region, is typically formed to surround the Schottky junction active region. The purpose of junction termination region is to reduce or prevent electric field crowding at the edges of the Schottky junction, and to reduce or prevent the depletion region from interacting with the surface of the device. Surface effects may cause the depletion region to spread unevenly, which may adversely affect the breakdown voltage of the device. Other termination techniques include field plates and floating field rings that may be more strongly influenced by surface effects. A channel stop region may also be formed by implantation of n-type dopants in order to prevent the depletion region from extending to the edge of the device.

Regardless of the type of termination used, the Schottky diode will fail if a large enough reverse voltage is applied to the junction. Such failures are generally catastrophic, and may damage or destroy the device. Furthermore, even before the junction has failed, a Schottky diode may experience large reverse leakage currents. In order to reduce such leakage currents, the junction barrier Schottky (JBS) diode was developed. JBS diodes are sometimes referred to as Merged PIN-Schottky (MPS) diodes. A conventional JBS diode 10 is illustrated in FIG. 1. As shown therein, a conventional JBS diode includes an n-type substrate 12 on which an n− drift layer 14 is formed. A plurality of p+ regions 16 are formed, typically by ion implantation, in the surface of the n− drift layer 14. A metal anode contact 18 is formed on the surface of the n− drift layer 14 in contact with both the n− drift layer 14 and the p+ regions 16. The anode contact 18 forms a Schottky junction with the exposed portions of the drift layer 14, and may form an ohmic contact with the p+ regions 16. A cathode contact 20 is formed on the substrate 12. Silicon carbide-based JBS diodes are described, for example, in U.S. Pat. Nos. 6,104,043 and 6,524,900.

In forward operation, the junction J1 between the anode contact 18 and the drift layer 14 turns on before the junction J2 between the p+ regions 16 and the drift layer 14. Thus, at low forward voltages, the device exhibits Schottky diode behavior. That is, current transport in the device is dominated by majority carriers (electrons) injected across the Schottky junction J1 at low forward voltages. As there may be no minority carrier injection (and thus no minority charge storage) in the device at normal operating voltages, JBS diodes have fast switching speeds characteristic of Schottky diodes.

Under reverse bias conditions, however, the depletion regions formed by the PN junctions J2 between the p+ regions 16 and the drift layer 14 expand to block reverse current through the device 10, protecting the Schottky junction J1 and limiting reverse leakage current in the device 10. Thus, in reverse bias, the JBS diode 10 behaves like a PIN diode. The voltage blocking ability of the device 10 is typically determined by the thickness and doping of the drift layer 14 and the design of the edge termination.

SUMMARY

An electronic device according to some embodiments includes a silicon carbide layer including an n-type drift region therein, a contact forming a Schottky junction with the drift region, and a p-type junction barrier region on the silicon carbide layer. The p-type junction barrier region includes a p-type polysilicon region forming a P-N heterojunction with the drift region and the p-type junction barrier region is electrically connected to the contact.

The Schottky junction between the contact and the drift region may be configured to turn on at a lower forward voltage than the P-N heterojunction between the junction barrier region and the drift region.

The contact may form an ohmic contact to the p-type polysilicon region, and the P-N heterojunction between the heterojunction barrier region and the drift region may be configured to begin to conduct majority carriers at a higher forward voltage than a turn on voltage of the Schottky junction and at a lower voltage at which the P-N heterojunction between the heterojunction barrier region and the drift region begins to inject minority carriers into the drift region.

The electronic device may further include a guard ring termination region at a surface of the silicon carbide layer laterally adjacent to the contact. The guard ring termination region may include a second p-type polysilicon region on the drift region, the second p-type polysilicon region being electrically isolated from the contact under zero bias conditions.

The electronic device may further include a junction termination region at the surface of the silicon carbide layer having a conductivity type opposite the conductivity type of the drift region, the second p-type polysilicon region extends into the junction termination region.

The junction barrier region may include a plurality of p-type polysilicon regions in the drift region and at least one p-type polysilicon minority injector pad in the drift region beneath the contact and electrically connected to the contact.

The minority injector pad may have a surface area in a horizontal plane parallel to a major surface of the silicon carbide layer that is larger than a surface area in the horizontal plane of one of the plurality of p-type polysilicon regions in the junction barrier region.

The minority carrier injector pad may have a surface area in a horizontal plane parallel to a major surface of the silicon carbide layer that is at least about 10% of a surface area of the drift region in the horizontal plane below the contact.

The electronic device may further include an n+ silicon carbide contact layer on the drift region opposite the contact, and a second contact on the contact layer.

An electronic device according to further embodiments includes a drift region having a first conductivity type, a contact forming a junction with the drift region, and a junction barrier region on the drift region, the junction barrier region having a second conductivity type opposite the first conductivity type and including a heterojunction barrier region on the drift region. The heterojunction barrier region forms a P-N heterojunction with the drift region and is in electrical contact with the contact.

The Schottky junction between the contact and the drift region may be configured to turn on at a lower forward voltage than the P-N heterojunction between the heterojunction barrier region and the drift region.

The contact may form an ohmic contact to the heterojunction barrier region, and the P-N heterojunction between the heterojunction barrier region and the drift region may be configured to begin to conduct majority carriers at a higher forward voltage than a turn on voltage of the Schottky junction and at a lower voltage at which the P-N heterojunction between the heterojunction barrier region and the drift region begins to inject minority carriers into the drift region.

The electronic device may further include a guard ring termination region on the drift region and laterally adjacent to the Schottky junction. The guard ring termination region may include a second heterojunction barrier region.

The heterojunction barrier region may include a plurality of p-type polysilicon regions on the drift region and at least one p-type polysilicon minority injector pad on the drift region beneath the contact and electrically connected to the contact.

The minority carrier injection pad may have a width that is greater than a width of the junction barrier region.

The minority injector pad may have a horizontal surface area that is larger than a horizontal surface area of one of the plurality of p-type polysilicon regions in the junction barrier region.

The drift region may include n-type silicon carbide and the heterojunction barrier region may include p-type polysilicon. In some embodiments, the drift region may include n-type silicon carbide and the heterojunction barrier region may include p-type gallium nitride.

Some embodiments include a termination region at a surface of the drift region and defining an active region of the device within the termination region, wherein a ratio of a surface area of the active region occupied by the heterojunction barrier regions to a total surface area of the active region is about 2% to about 40%. In some embodiments, the ratio is about 4% to about 30%. In some other embodiments, the ratio is about 10% to about 30%, and in further embodiments the ratio is about 20% to about 30%.

Methods of forming an electronic device according to some embodiments include providing a drift region having a first conductivity type, providing a heterojunction barrier region on the drift region, the heterojunction barrier region including a material different from the drift region and having a conductivity type opposite the conductivity type of the drift region and providing a P-N heterojunction with the drift region, and forming a contact on the drift region and on the heterojunction barrier region, the contact forming a Schottky junction with the drift region and forming an ohmic junction with the heterojunction barrier region.

The drift region may include n-type silicon carbide and the heterojunction barrier region may include p-type polysilicon.

The methods may further include providing a guard ring termination region on the drift region laterally adjacent to the Schottky junction, the guard ring termination region may include a second heterojunction barrier region on the drift region.

Providing the heterojunction barrier region may include etching a recess in the drift region, depositing a polysilicon layer in the recess, doping the polysilicon layer to have a conductivity type opposite the conductivity type of the drift region, and patterning the polysilicon layer.

An electronic device according to further embodiments includes a silicon carbide layer including a drift region having a first conductivity type, a contact on a surface of the drift region and forming a Schottky junction with the drift region, and a guard ring in contact with the surface of the silicon carbide layer adjacent to the Schottky junction. The guard ring has a conductivity type opposite the conductivity type of the drift region and includes a material that forms a heterojunction with the silicon carbide layer. The guard ring may include polysilicon and/or gallium nitride.

An electronic device according to some embodiments includes a drift region having a first conductivity type, a contact forming a metal-semiconductor junction with the drift region, and a guard ring on the drift region and laterally adjacent to the junction, the guard ring having a second conductivity type opposite the first conductivity type. The guard ring includes a material that forms a P-N heterojunction with the drift region.

BRIEF DESCRIPTION OF THE DRAWINGS

The accompanying drawings, which are included to provide a further understanding of the invention and are incorporated in and constitute a part of this application, illustrate certain embodiment(s) of the invention. In the drawings.

DETAILED DESCRIPTION OF EMBODIMENTS OF THE INVENTION

Figure 1:
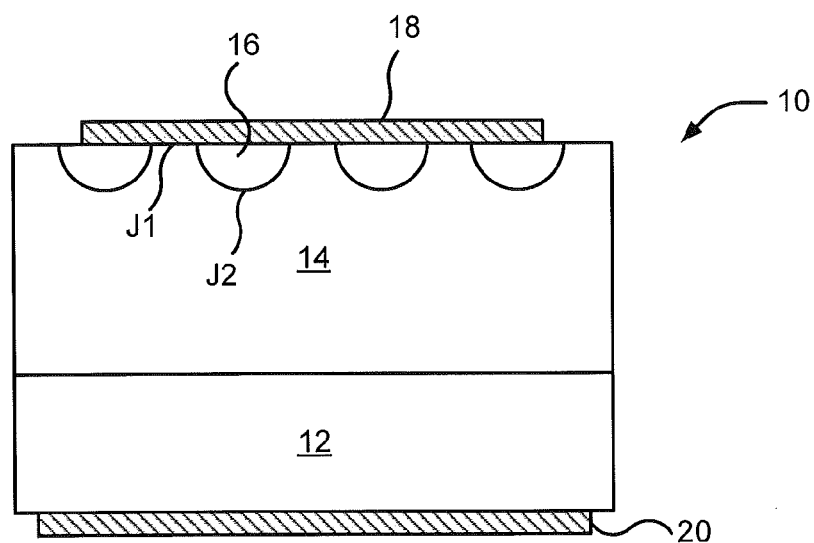
FIG. 1 is a cross-sectional view of a conventional JBS diode.

Embodiments of the present invention now will be described more fully hereinafter with reference to the accompanying drawings, in which embodiments of the invention are shown. This invention may, however, be embodied in many different forms and should not be construed as limited to the embodiments set forth herein. Rather, these embodiments are provided so that this disclosure will be thorough and complete, and will fully convey the scope of the invention to those skilled in the art. Like numbers refer to like elements throughout.

It will be understood that, although the terms first, second, etc. may be used herein to describe various elements, these elements should not be limited by these terms. These terms are only used to distinguish one element from another. For example, a first element could be termed a second element, and, similarly, a second element could be termed a first element, without departing from the scope of the present invention. As used herein, the term "and/or" includes any and all combinations of one or more of the associated listed items.

The terminology used herein is for the purpose of describing particular embodiments only and is not intended to be limiting of the invention. As used herein, the singular forms "a", "an" and "the" are intended to include the plural forms as well, unless the context clearly indicates otherwise. It will be further understood that the terms "comprises" "comprising," "includes" and/or "including" when used herein, specify the presence of stated features, integers, steps, operations, elements, and/or components, but do not preclude the presence or addition of one or more other features, integers, steps, operations, elements, components, and/or groups thereof.

Unless otherwise defined, all terms (including technical and scientific terms) used herein have the same meaning as commonly understood by one of ordinary skill in the art to which this invention belongs. It will be further understood that terms used herein should be interpreted as having a meaning that is consistent with their meaning in the context of this specification and the relevant art and will not be interpreted in an idealized or overly formal sense unless expressly so defined herein.

It will be understood that when an element such as a layer, region or substrate is referred to as being "on" or extending "onto" another element, it can be directly on or extend directly onto the other element or intervening elements may also be present. In contrast, when an element is referred to as being "directly on" or extending "directly onto" another element, there are no intervening elements present. It will also be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present.

Relative terms such as "below" or "above" or "upper" or "lower" or "horizontal" or "lateral" or "vertical" may be used herein to describe a relationship of one element, layer or region to another element, layer or region as illustrated in the figures. It will be understood that these terms are intended to encompass different orientations of the device in addition to the orientation depicted in the figures.

Embodiments of the invention are described herein with reference to cross-section illustrations that are schematic illustrations of idealized embodiments (and intermediate structures) of the invention. The thickness of layers and regions in the drawings may be exaggerated for clarity. Additionally, variations from the shapes of the illustrations as a result, for example, of manufacturing techniques and/or tolerances, are to be expected. Thus, embodiments of the invention should not be construed as limited to the particular shapes of regions illustrated herein but are to include deviations in shapes that result, for example, from manufacturing. For example, an implanted region illustrated as a rectangle will, typically, have rounded or curved features and/or a gradient of implant concentration at its edges rather than a discrete change from implanted to non-implanted region. Likewise, a buried region formed by implantation may result in some implantation in the region between the buried region and the surface through which the implantation takes place. Thus, the regions illustrated in the figures are schematic in nature and their shapes are not intended to illustrate the actual shape of a region of a device and are not intended to limit the scope of the invention.

Some embodiments of the invention are described with reference to semiconductor layers and/or regions which are characterized as having a conductivity type such as n-type or p-type, which refers to the majority carrier concentration in the layer and/or region. Thus, n-type material has a majority equilibrium concentration of negatively charged electrons, while p-type material has a majority equilibrium concentration of positively charged holes. Some material may be designated with a "+" or "−" (as in n+, n−, p+, p−, n++, n−−, p++, p−−, or the like), to indicate a relatively larger ("+") or smaller ("−") concentration of majority carriers compared to another layer or region. However, such notation does not imply the existence of a particular concentration of majority or minority carriers in a layer or region.

According to some embodiments, a junction barrier Schottky diode includes features, such as junction barrier regions and/or edge termination features, on or in a drift layer, wherein the junction barrier regions and/or edge termination features are provided by regions of a different material type than the drift layer, and form respective heterojunctions with the drift layer. In some embodiments, the features, such as junction barrier regions and/or edge termination features, may include doped polysilicon, which can be formed, for example, using conventional processes that may not require ion implantation.

Figure 2:
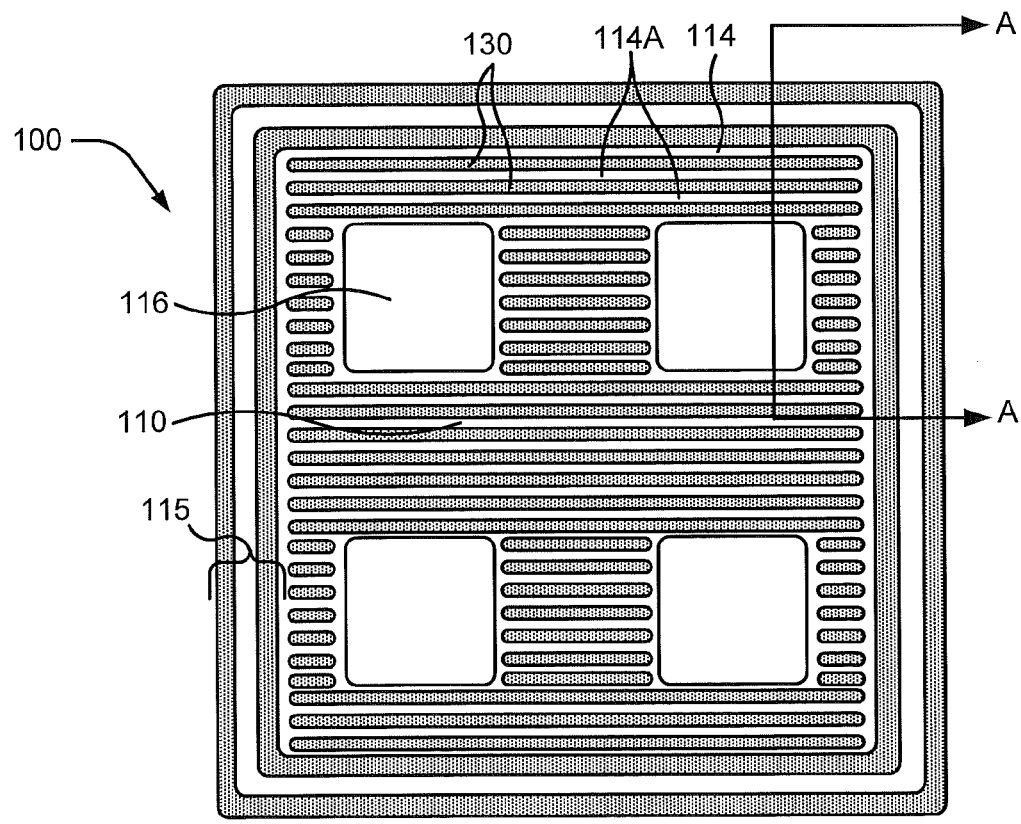
FIG. 2 is a top view of a JBS diode according to some embodiments of the present invention.
Figure 3:
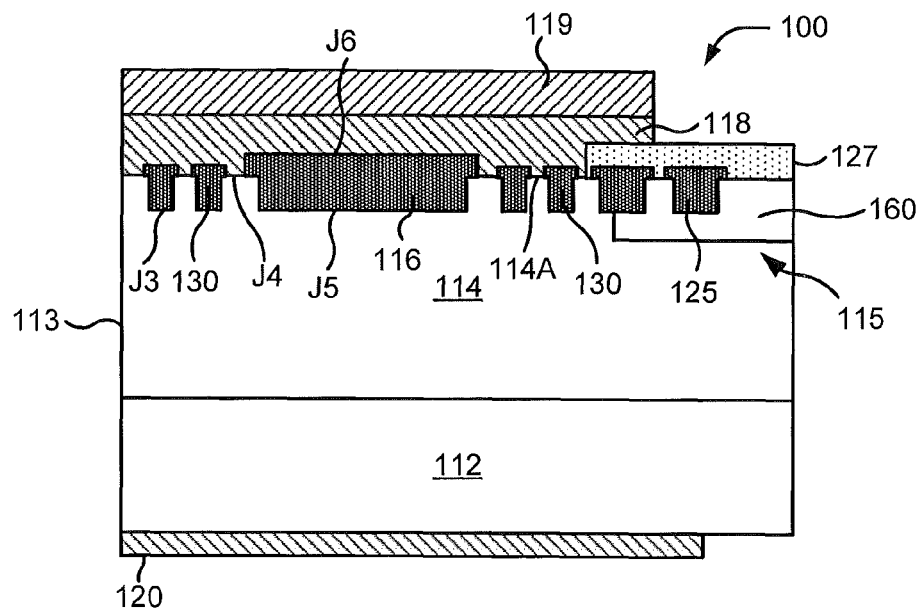
FIGS. 3, 4 and 5 are cross-sectional views of JBS diodes according to some embodiments of the present invention.
Figure 4:
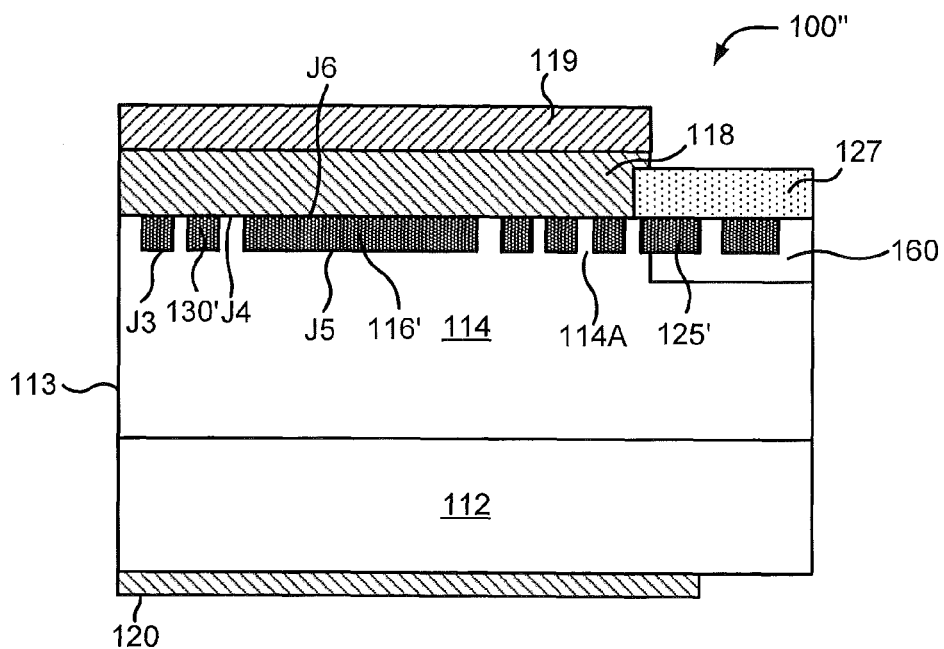
Figure 5:
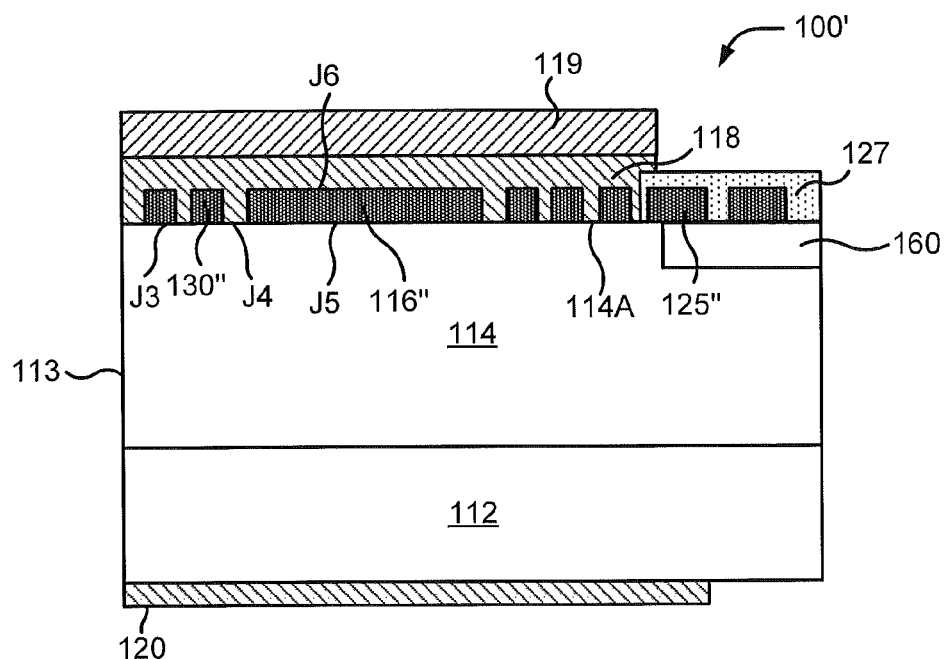

FIG. 2 is a top view of a diode 100 according to some embodiments of the invention, and FIG. 3 is a partial cross-sectional view of the diode 100 taken along line A-A of FIG. 2. FIGS. 4 and 5 are similar cross sectional illustrations of diodes 100' and 100", respectively, according to other embodiments. The dimensions of some features of the diodes 100, 100', 100" are exaggerated for clarity.

Referring to FIGS. 2 and 3, the diode 100 includes an optional substrate 112 on which a layer 113 including a drift region 114 is formed. The layer 113 has an upper surface, opposite the substrate, in which a plurality of heterojunction barrier regions 130 are formed. A Schottky contact 118 is on the drift region 114. The Schottky contact 118 contacts the surface of the drift region 114 and forms a Schottky junction J4 with the drift region 114. The Schottky contact 118 also contacts the plurality of heterojunction barrier regions 130.

The layer 113 may be formed, for example, from n-type silicon carbide of the 2H, 4H, 6H, 3C and/or 15R polytype. The drift region 114 may have a dopant concentration of about $2 \times 10^{14}$ to about $1 \times 10^{17}$ cm$^{-3}$, depending on design requirements for voltage blocking and on-resistance for the diode 100. Other types of semiconductor materials, such as GaN, GaAs, silicon or germanium may be used. In particular embodiments, the drift region 114 includes 4H—SiC doped with n-type dopants at a concentration of about $5 \times 10^{15}$ cm$^{-3}$.

The heterojunction barrier regions 130 are formed from a semiconducting material that is different from the material of the drift region 114. The heterojunction barrier regions 130 have a conductivity type that is opposite the conductivity type of the drift region 114. Accordingly, the heterojunction barrier regions 130 form P-N heterojunctions J3 with the drift region 114. Furthermore, the Schottky contact 118 may form an ohmic junction with the heterojunction barrier regions 130.

In some embodiments, the barrier height of the P-N heterojunction J3 between the heterojunction barrier regions 130 and the drift layer may be higher than a barrier height of the Schottky junction J4 between a Schottky contact 118 and the drift region 114, so that the P-N heterojunction J3 will turn on at a higher forward voltage than the Schottky junction J4 between the drift region 114 and the Schottky contact 118, as will be discussed in more detail below.

In the embodiments of FIGS. 2 and 3, the heterojunction barrier regions 130 are formed as stripe-shaped regions in the drift region 114. However, the heterojunction barrier regions 130 may be formed in other shapes, such as islands, squares, dots, hexagons, or any other desired shape.

In some embodiments, the heterojunction barrier regions 130 may be provided as regions of doped polysilicon. For example, the heterojunction barrier regions 130 may include polysilicon regions doped to have a conductivity that is opposite the conductivity type of the drift region 114, so that the heterojunction barrier regions 130 form P-N heterojunctions J3 with the drift region 114.

The heterojunction barrier regions 130 may be doped with p-type dopants, such as boron and/or aluminum, at a concentration of about $1 \times 10^{17}$ to about $1 \times 10^{20}$ cm$^{-3}$, and may extend to a depth of about 0.3 to about 0.5 µm into the drift region 114 from the surface of the drift region 114. In particular embodiments, the heterojunction barrier regions 130 may be doped at a dopant concentration of about $5 \times 10^{18}$ cm$^{-3}$, and may extend to a depth of about 0.3 µm into the drift region 114 from the surface of the drift region 114.

One or more current surge pads 116 may also be provided in the drift region 114. The current surge pads 116 may be formed of the same material as the heterojunction barrier regions 130. For example, the current surge pads 116 may be provided as polysilicon regions doped with p-type dopants, such as boron and/or aluminum, at a concentration of about $1 \times 10^{18}$ to about $1 \times 10^{20}$ cm$^{-3}$, and may extend to a depth of about 0.3 to about 0.5 µm into the drift region 114. In particular embodiments, the current surge pads 116 may be doped at a dopant concentration of about $5 \times 10^{18}$ cm$^{-3}$, and may extend to a depth of about 0.3 µm into the drift region 114. The current surge pads 116 have a larger width than the heterojunction barrier regions 130 to encourage the flow of surge current through the current surge pads at high forward voltages, as will be discussed in more detail below. For example, the current surge pads 116 may have a width of about 10 µm to about 250 µm. In particular embodiments, the current surge pads 116 may have a width of about 20 µm.

In some embodiments, the current surge pads 116 and/or heterojunction barrier regions 130 may be formed of other types of materials that can be doped to have a conductivity that is opposite the conductivity of the drift region 114 and can form a heterojunction J5 with the drift region 114. For example, when the drift region comprises n-type silicon carbide, a material such as p-type gallium nitride can be used to form the current surge pads 116 and/or heterojunction barrier regions 130.

The heterojunction barrier regions 130 shown in the embodiments of FIGS. 2 and 3 are provided as spaced apart striped regions that expose portions 114A of the surface of the drift region 114 and that extend across an active region 110 of the drift region 114 (except for the exposed portions 114A of the drift layer and the current surge pads 116). A metal Schottky contact 118 covers the drift region 114 and forms Schottky rectifying junctions with the exposed portions 114A of the drift region 114 as well as the heterojunction barrier regions 130 and the current surge pads 116.

As used herein, the term "active region" refers to the two dimensional area of the device in which the Schottky metal contacts the drift layer, and includes the exposed portions 114A of the drift region 114, the heterojunction barrier 130 and the current surge pads 116. Accordingly, the active region includes the Schottky junction area but does not include, for example, the edge termination region described below.

The diode 100 may include an edge termination region 115 surrounding the active region 110 of the diode 100. The edge termination region 115 may include a junction termination extension (JTE) region, field rings, field plates, guard rings, and/or a combination of the foregoing or other terminations. In particular, the device 100 may include a plurality of guard rings 125, which may be formed of the same material as the heterojunction barrier regions 130 and the current surge pad 116, and may also be doped to have a conductivity opposite the conductivity type of the drift region 114. A passivation layer, such as a field oxide layer 127, may be formed on the drift layer and may cover the guard rings 125. The guard rings 125 may be floating guard rings that are electrically isolated from the anode contact 118 under zero bias conditions.

In some embodiments, the edge termination region 115 includes a robust guard ring (RGR) termination as described in U.S. Pat. No. 7,026,650, which is assigned to the assignee of the present invention, the disclosure of which is incorporated herein by reference as if set forth fully. In particular, the RGR termination may include an implanted region 160 of dopants having a conductivity opposite the conductivity of the drift layer. The implanted region 160 may extend to a depth in the drift region 114 that is greater or less than the depth of the guard rings 125. The implanted region 160 may have a net concentration of dopants having a conductivity opposite the conductivity type of the drift region 114 of about $1 \times 10^{17}$ cm$^{-3}$.

Additional conventional terminations of SiC Schottky diodes are described in "Planar Terminations in 4H—SiC Schottky Diodes With Low Leakage And High Yields" by Singh et al., ISPSD '97, pp. 157 160. A p-type epitaxy guard ring termination for a SiC Schottky Barrier Diode is described in "The Guard-Ring Termination for High-Voltage SiC Schottky Barrier Diodes" by Ueno et al., IEEE Electron Device Letters, Vol. 16, No. 7, July, 1995, pp. 331 332. Additionally, other termination techniques are described in published PCT Application No. WO 97/08754 entitled "SiC Semiconductor Device Comprising A PN Junction With A Voltage Absorbing Edge."

The current surge pads 116 and the heterojunction barrier regions 130 may be formed within recesses in the drift region 114, and may protrude above an upper surface of the drift region 114. As the current surge pads 116 and the heterojunction barrier regions 130 have an opposite conductivity type from the drift region 114, the heterojunction barrier regions 130 form P-N junctions J3 with the drift region 114, while the current surge pads 116 form P-N junctions J5 with the drift region 114.

In the diode 100' illustrated in FIG. 4, the current surge pads 116', the heterojunction barrier regions 130' and the guard rings 125' are formed within recesses in the drift region 114, and are flush with the upper surface of the drift region 114. For example, polysilicon may be deposited into the recesses in the drift region 114 and planarized using a chemical-mechanical polish (CMP) or etch back technique to form the current surge pads 116', the heterojunction barrier regions 130', and/or the guard rings 125', as shown in FIG. 4.

In the diode 100" illustrated in FIG. 5, the current surge pads 116", the heterojunction barrier regions 130" and the guard rings 125" are formed as discrete regions on the upper surface of the drift region 114, and do not extend into the drift region 114. For example, polysilicon may be deposited onto the drift region 114 and patterned using photolithography to form the current surge pads 116", the heterojunction barrier regions 130", and/or the guard rings 125", as shown in FIG. 5.

Referring again to FIG. 3, the ratio of the surface area of the active region 110 of the device 100 occupied by the heterojunction barrier regions 130 and the current surge pads 116 to the total surface area of the active region 110 may affect both the reverse leakage current of the device 100 and the forward voltage drop of the device 100. For example, if the area occupied by the heterojunction barrier regions 130 and the current surge pads 116 is increased relative to the total area of the active region 110, the reverse leakage current may be reduced, but the forward voltage drop of the device 100 may increase. Thus, the selection of the ratio of the surface area of the active region 110 of the device 100 occupied by the heterojunction barrier regions 130 and the current surge pads 116 to the total surface area of the active region 110 may entail a trade-off between reverse leakage current and forward voltage drop. In some embodiments, the ratio of the surface area of the active region 110 of the device 100 occupied by the heterojunction barrier regions 130 and the current surge pads 116 to the total surface area of the active region 110 may be between about 2% and 40%. In some other embodiments, the ratio of the surface area of the active region 110 of the device 100 occupied by the heterojunction barrier regions 130 and the current surge pads 116 to the total surface area of the active region 110 may be between about 4% and 30%. In further embodiments, the ratio may be about 10% to about 30%, and in still further embodiments, the ratio may be about 20% to about 30%.

The Schottky contact 118 on the surface of the drift region 114 forms a Schottky junction J4 with the exposed portions 114A of the drift region 114 between adjacent heterojunction barrier regions 130. The anode contact 118 may include a metal, such as aluminum, titanium and/or nickel. In some embodiments, the anode contact 118 may form an ohmic contact with the current surge pad 116. A metal overlayer 119 may be formed on the Schottky contact 118. The metal overlayer 119 may comprise TiW/Al, for example, and may be provided as a contact layer on the Schottky contact 118.

A cathode contact 120 is formed on a side of the substrate 112 opposite the drift region 114 and/or directly on the drift region 114. The cathode contact 120 may include a metal, such as nickel, that is capable of forming an ohmic contact to n-type silicon carbide.

Under reverse bias conditions, the depletion regions formed by the p-n junctions J3 between the heterojunction barrier regions 130 and the drift region 114, as well as the depletion region of the p-n junction J5, may expand to block reverse current through the device 100, protecting the Schottky junction J4 and limiting reverse leakage current in the device 100. Thus, in reverse bias, the diode 100 may function substantially like a PIN diode.

In forward operation, the Schottky junction J4 between the anode contact 118 and the exposed portions 114A of the drift region 114 turns on before the heterojunction J3 and the junction J5 between the current surge pad 116 and the drift region 114. Thus, at low forward voltages, the device exhibits Schottky diode behavior, and the operation of the diode 100 will be dominated by the injection of majority carriers across the Schottky junction J4. Due to the absence of minority carrier injection under normal operating conditions, the diode 100 may have a very fast switching capability, which is characteristic of Schottky diodes in general.

The current surge pad 116 may be designed to begin to conduct at a forward voltage that is higher than the turn-on voltage of the Schottky junction J4. Thus, in the event of a current surge that causes the forward voltage of the diode 100 to increase, the p-n junction J5 will begin to conduct. Once the p-n junction J5 begins to conduct, the operation of the diode 100 is dominated by the injection and recombination of minority carriers across the p-n junction J5. In that case, the forward voltage drop of the diode 100 may be clamped, which may decrease the amount of power dissipated by the diode 100 for a given level of current. Thus, turn-on of the p-n junction J5 when the forward voltage of the diode 100 increases may reduce and/or prevent forward current runaway in the diode 100.

Furthermore, in a device according to some embodiments, the turn-on of the p-n junctions J3 and J5 may occur in stages. In a first stage, the Schottky junction J4 between the drift region 114 and the Schottky contact 118 may turn on, resulting in majority carrier conduction. In a second stage, as the bias on the P-N heterojunction J3 increases, majority carriers may be injected across the P-N heterojunction J3, allowing for further reduction in on-resistance. Furthermore, in a device according to some embodiments, the turn on of junction J5 may occur in stages, resulting in minority carrier injection allowing for surge current capability.

Figure 6:
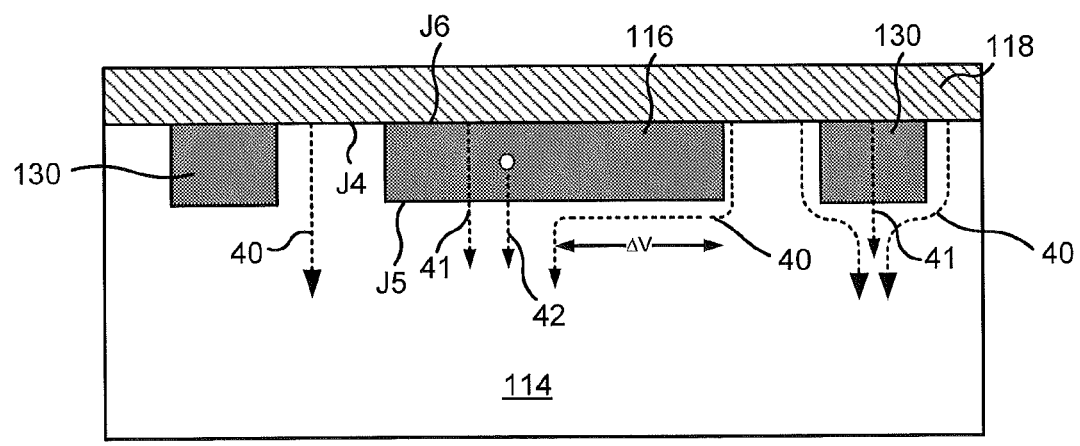
FIG. 6 is a cross-sectional detail of portions of a JBS diode according to some embodiments of the invention.
Figure 7:
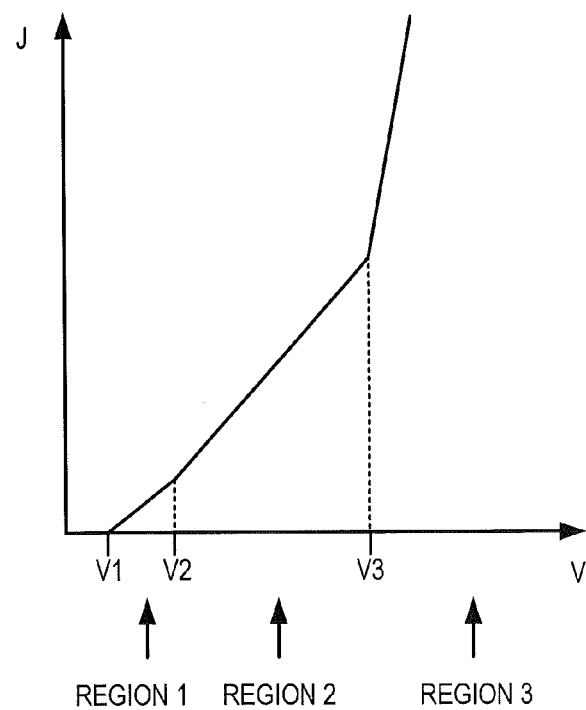
FIG. 7 is a graph that schematically illustrates various regions in a current-voltage characteristic of a JBS diode according to some embodiments of the invention.

Forward current operation of a device according to some embodiments is illustrated in FIGS. 6 and 7. In particular, FIG. 6 is a magnified illustration of a portion of a drift region 114 include a current surge pad 116 and two heterojunction barrier regions 130. Forward current components 40, 41 and 42 are illustrated in FIG. 6. FIG. 7 is a schematic graph of current density (J) versus forward voltage (V) for a Schottky diode according to some embodiments. As shown in FIG. 7, the current-voltage characteristic of a Schottky diode according to some embodiments may have three distinct regions of operation, shown in FIG. 7 as Region 1, Region 2 and Region 3.

Referring to FIG. 6, when a forward voltage is applied to the Schottky contact 118 relative to the drift region 114 that is sufficient to turn on the Schottky junction J4 between the Schottky contact 118 and the drift region 114, majority carriers (e.g., electrons in the case of an n-type drift layer) are injected into the drift layer, resulting in a Schottky current component 40. Before the P-N heterojunction J5 between the current surge pad 116 and the drift region 114, the P-N heterojunction J3, and the ohmic junction J6 between the anode contact 118 and the current surge pad 116 have turned on, the Schottky current component 40 is the only component of the device current. This is illustrated as Region 1 in the graph of FIG. 7, where the forward voltage of the device is between V1 and V2. V1 represents the turn-on voltage of the Schottky junction J4, while V2 represents the turn-on voltage of the heterojunction J3 between the heterojunction barrier region 130 and the drift region 114.

In particular embodiments, the turn-on voltage of the Schottky junction J4 may be about 0.8 V when the Schottky contact 118 is titanium and the drift region 114 is n-type silicon carbide, while the turn-on voltage of the junction J3 between the heterojunction barrier region 130 and the drift region 114 may be about 1.5 V.

As shown in FIG. 6, the Schottky current 40 spreads laterally beneath the current surge pad 116 and the heterojunction barrier regions 130, resulting in spreading resistance in the device. Thus, the current-voltage curve shown in FIG. 7 may have a relatively low slope in Region 1.

When the forward voltage of the device reaches V2, the heterojunction J3 between the heterojunction barrier region 130 and the drift region 114 and the heterojunction J5 between the current surge pad 116 and the drift region 114 may turn on, resulting in unipolar injection of electrons 41 into the drift region. The device may still exhibit some spreading resistance. However, the overall resistance of the device may decrease, resulting in a increased slope in Region 2 of the current-voltage curve shown in FIG. 7 relative to Region 1.

As the voltage on the device increases, the Schottky current through junction J4 increases. The voltage drop $\Delta V$ across the current surge pad 116 also increases to the point where the P-N heterojunction J5 between the current surge pad 116 and the drift region 114 begins to inject minority carriers 42 (e.g., holes in the case of an n-type drift layer) into the drift region 114. This condition is illustrated as Region 3 of FIG. 7. The resistance of the device is further reduced, increasing the slope of the current-voltage curve in Region 3.

It will be appreciated that the voltage drop $\Delta V$ across the half-width of the current surge pad 116, which is greater than the half-width of the heterojunction barrier regions 130, where "half-width" refers to the minimum lateral distance from an edge of the feature to a center of the feature, i.e., the minimum distance that laterally spreading current must travel to reach the center point of the feature. As the width of the current surge pad 116 is greater than the widths of the heterojunction barrier regions 130, the junction J5 between the current surge pad 116 and the drift layer will tend to turn on before the junctions between the heterojunction barrier regions 130 and the drift region 114.

Figure 8:
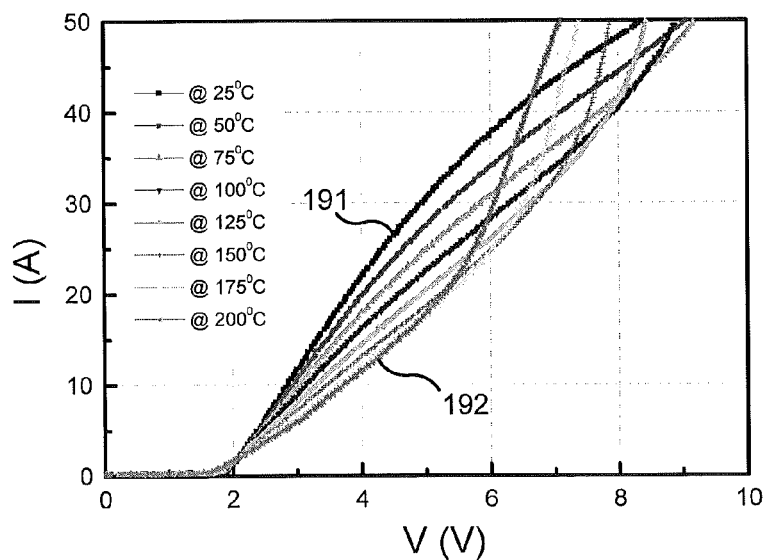
FIG. 8 is a graph illustrating simulated forward current-voltage curves at operating temperatures ranging from 25° C. to 200° C. for a device according to some embodiments.

Empirical forward current-voltage curves at operating temperatures ranging from 25° C. to 200° C. for a device according to some embodiments with p+ polysilicon as the Schottky contact are illustrated in FIG. 8. For example, a current-voltage curve according to some embodiments at 25° C. is illustrated as curve 191, while to a current-voltage curve according to some embodiments at 200° C. is illustrated as curve 192. These curves indicate that surge capability of diodes according to some embodiments is enhanced at high temperature, as the slope of the curves increases with temperature and forward voltage. The device illustrated in FIG. 8 starts conducting at about 1.8 V instead of the Ti—SiC Schottky turn-on voltage of 0.8V because polysilicon was used as the anode contact 118.

Figure 9:
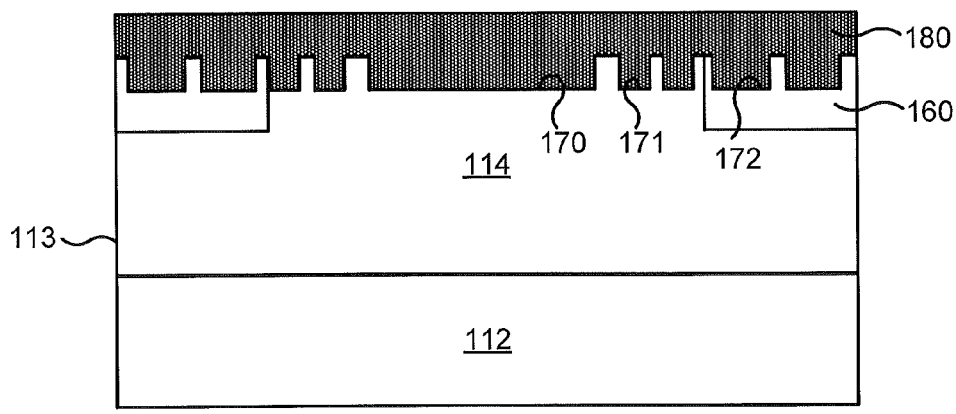
FIGS. 9-12 are cross-sectional views illustrating the formation of JBS diodes according to some embodiments of the present invention.

FIGS. 9-12 illustrate methods of forming devices according to some embodiments. Referring to FIG. 9, a drift region 114 is provided. The drift region 114 may be provided on a substrate 112. However, it will be appreciated that the substrate 112 is optional and may be removed or omitted in some embodiments.

The drift region 114 may be formed, for example, from n-type silicon carbide of the 2H, 4H, 6H, 3C and/or 15R polytype having a dopant concentration of about $2\times10^{14}$ to about $1\times10^{17}$ cm$^{-3}$, depending on design requirements for voltage blocking and on-resistance for the diode 100. Other types of semiconductor materials, such as GaN, GaAs, silicon or germanium may be used. In particular embodiments, the drift region 114 includes 4H—SiC doped with n-type dopants at a concentration of about $5\times10^{15}$ cm$^{-3}$.

Optional implanted regions 160 may be formed at the device periphery to provide a robust guard ring termination.

A plurality of recesses 170, 171 and 172 are formed in a surface of a drift region 114, for example by masking and etching techniques which are well known in the art. The recesses 170, 171 and 172 may extend to a depth of about 0.3 to about 0.5 μm into the drift region 114 from the surface of the drift region 114. A layer of a material 180, such as polysilicon, which forms a heterojunction with the drift layer, is deposited on the surface of the drift layer and into the recesses 170, 171, 172. The layer 180 of polysilicon may be doped with p-type dopants, such as boron and/or aluminum, at a concentration of about $1\times10^{18}$ to about $1\times10^{19}$ cm$^{-3}$, and in particular embodiments at a dopant concentration of about $5\times10^{18}$ cm$^{-3}$. The layer 180 of polysilicon may be doped using any conventional doping technique, such as in-situ doping, spinning-on, diffusion and drive-in annealing, etc.

Figure 10:
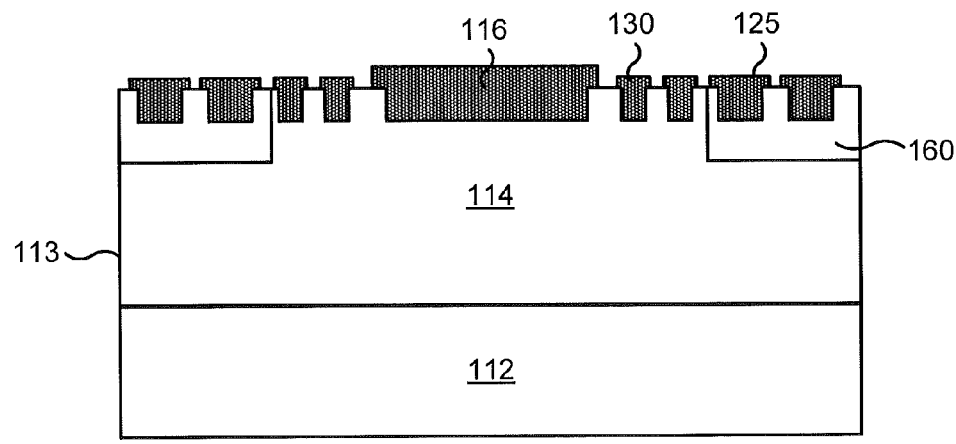
Figure 11:
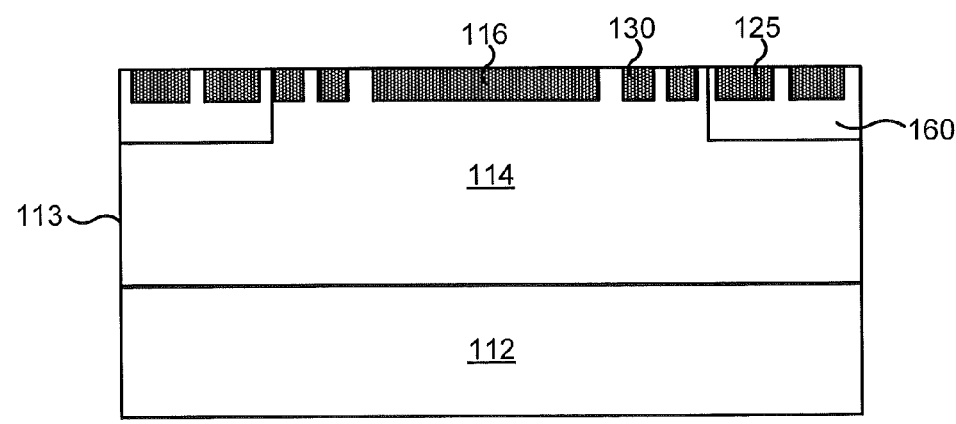

The layer 180 may be patterned using photolithographic techniques to form respective current surge pads 116, heterojunction barrier regions 130 and/or guard rings 125 that protrude above the surface of the drift region 114 (FIG. 10). In some embodiments, the layer 180 may be planarized using chemical-mechanical polish and/or etchback techniques to form respective current surge pads 116, heterojunction barrier regions 130 and guard rings 125 that are flush with the surface of the drift region 114 (FIG. 11).

Figure 12:
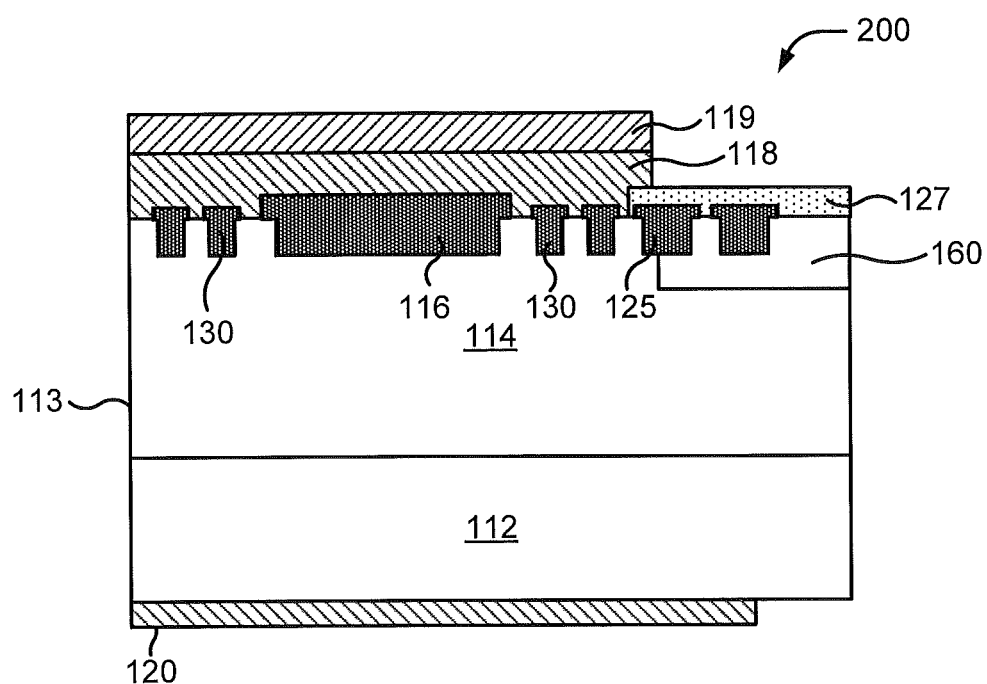

Referring to FIG. 12, a Schottky contact 118 may be formed on the drive region 114 and may include a metal, such as aluminum, titanium and/or nickel. In some embodiments, the contact 118 may form an ohmic contact with the current surge pad 116 and a Schottky contact with the drift region 114. A metal overlayer 119 may be formed on the Schottky contact 118. The metal overlayer 119 may comprise TiW/Al, for example, and may be provided as a contact layer on the Schottky contact 118.

A cathode contact 120 is formed on a side of the substrate 112 opposite the drift region 114. The cathode contact 120 may include a metal, such as nickel, that is capable of forming an ohmic contact to n-type silicon carbide.

An implanted region 160 of dopants having a conductivity opposite the conductivity of the drift layer may be formed beneath the guard rings 125 to probed a robust guard ring (RGR) termination. The implanted region 160 may extend to a depth in the drift layer that is greater or less than the depth of the guard rings, and may have a net concentration of dopants having a conductivity opposite the conductivity type of the drift region 114 of about $1 \times 10^{17}$ cm$^{-3}$. Finally, a field oxide layer 127 may be formed on the drift layer and may cover the guard rings 125.

Figure 13A:
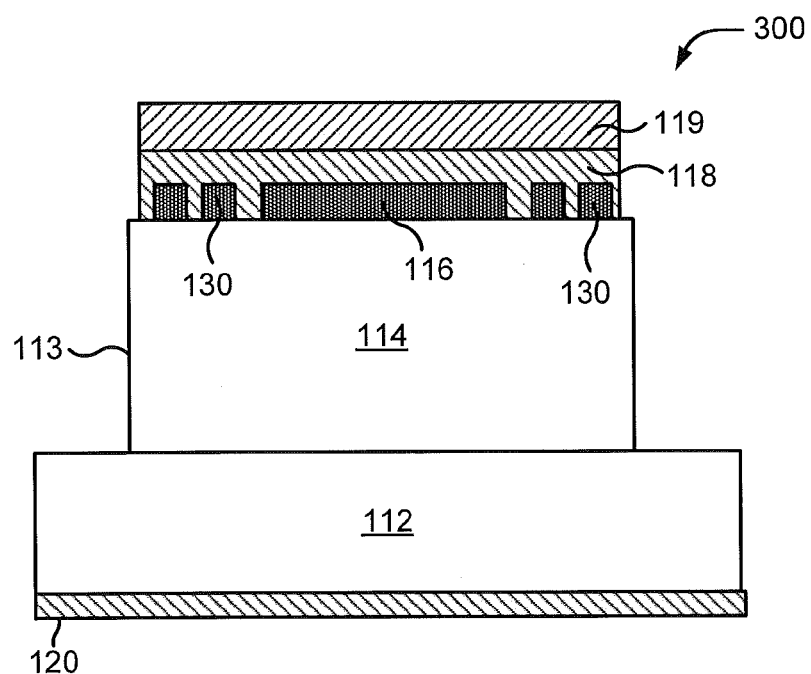
FIGS. 13A and 13B are cross-sectional views of JBS diodes according to some embodiments of the present invention.
Figure 13B:
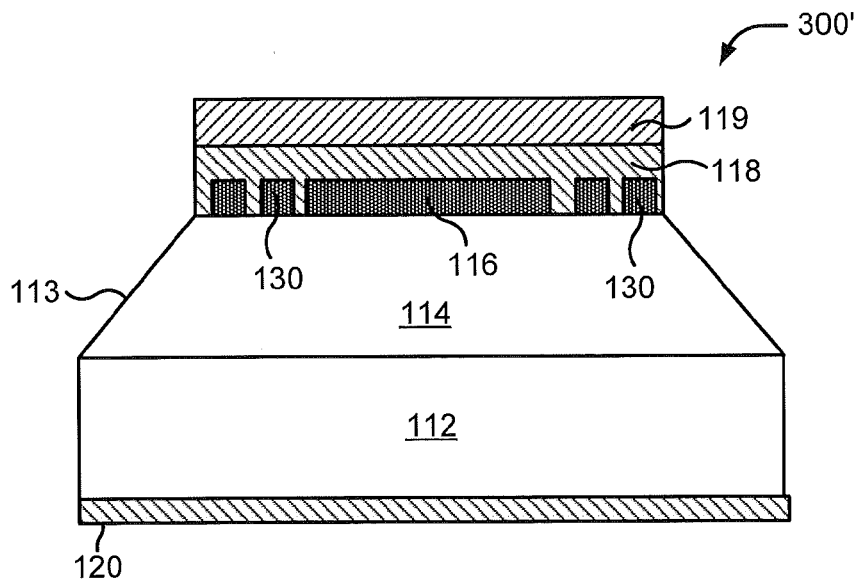

Further embodiments are illustrated in FIGS. 13A and 13B, which are a cross-sectional views of devices 300 and 300', respectively, that have a mesa termination (FIG. 13A) and a beveled edge termination (FIG. 13B), as opposed to guard ring termination.

Figure 14:
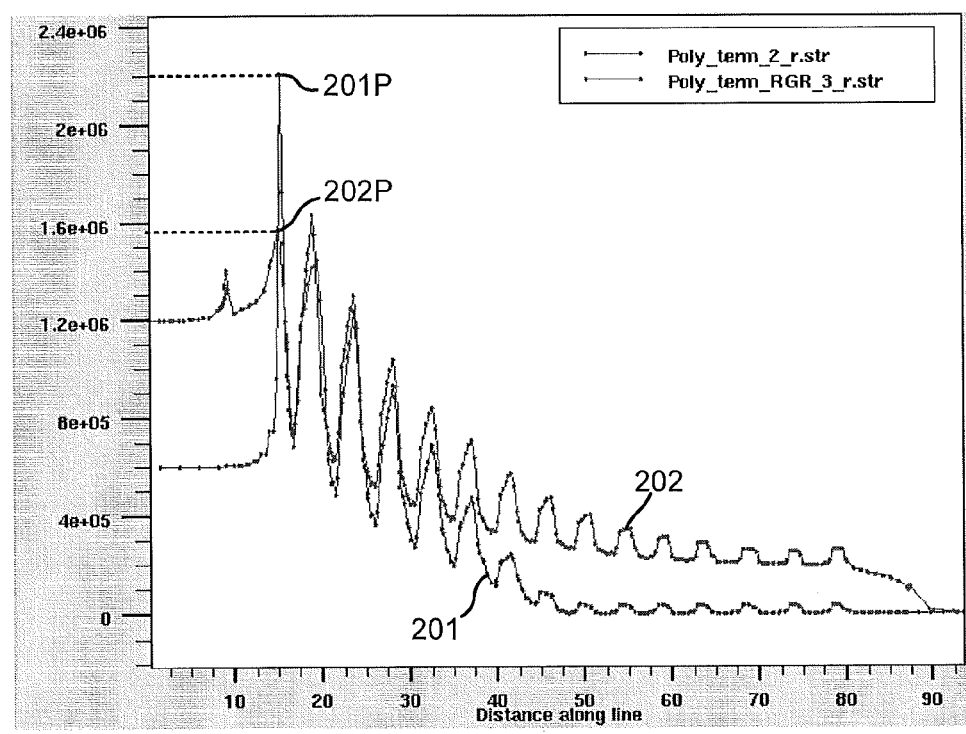
FIG. 14 is a graph illustrating simulated horizontal electric field distributions for a device according to some embodiments.

FIG. 14 is a graph illustrating simulated horizontal electric field distributions for a device according to some embodiments including heterojunction barrier regions and a heterojunction guard ring termination (curve 201) and a device according to some embodiments including heterojunction barrier regions and a heterojunction guard ring termination with a robust guard ring termination including implanted regions 160 (curve 202). As can be seen in FIG. 14, a peak electric field 201P for the device represented by curve 201 may be substantially higher than a peak electric field 202P for the device represented by curve 202.

Figure 15:
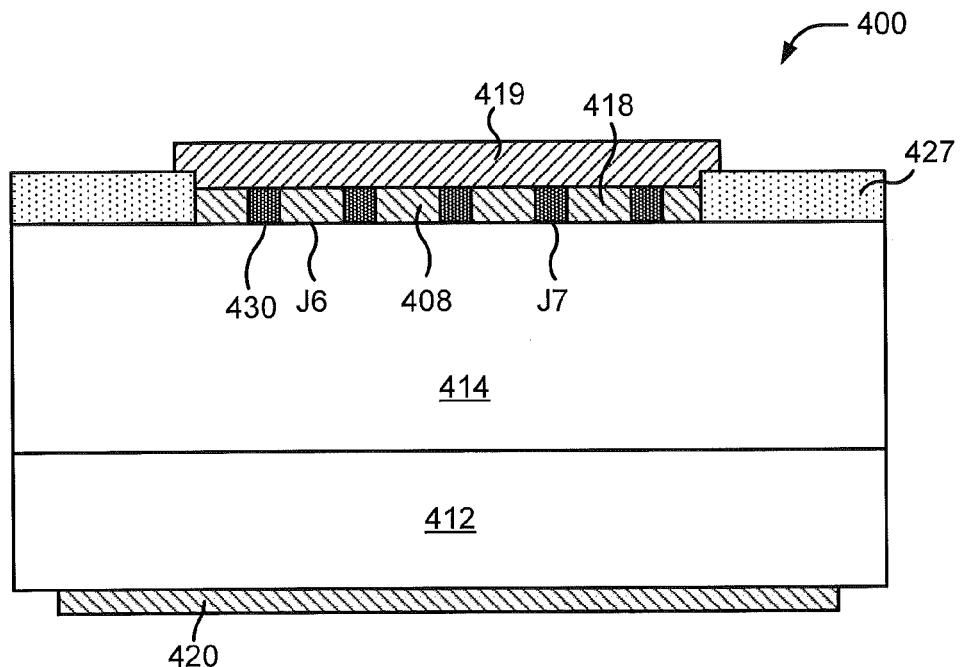
FIGS. 15-18 are cross-sectional views of JBS diodes according to various further embodiments of the present invention.

FIG. 15 is a partial cross-sectional view of a diode 400 according to further embodiments.

The diode 400 includes a substrate 412 on which a drift layer 414 is formed. The drift layer 414 has an upper surface, opposite the substrate, on which a Schottky contact layer 418 is formed. The Schottky contact layer 418 includes a plurality of heterojunction barrier regions 430 therein. The Schottky contact layer 418 may include n-type polysilicon, and the heterojunction barrier regions 430 may include p-type polysilicon. The n-type polysilicon of the Schottky contact layer 418 contacts the surface of the drift region 414 and forms a Schottky junction J6 with the drift region 414.

The drift layer 414 may be formed, for example, from n-type silicon carbide of the 2H, 4H, 6H, 3C and/or 15R polytype. The drift region 414 may have a dopant concentration of about $2 \times 10^{14}$ to about $1 \times 10^{17}$ cm$^{-3}$, depending on design requirements for voltage blocking and on-resistance for the diode 400. Other types of semiconductor materials, such as GaN, GaAs, silicon or germanium may be used. In particular embodiments, the drift region 414 includes 4H–SiC doped with n-type dopants at a concentration of about $5 \times 10^{15}$ cm$^{-3}$.

The heterojunction barrier regions 430 have a conductivity type that is opposite the conductivity type of the drift region 414. Accordingly, the heterojunction barrier regions 430 form P-N heterojunctions with the drift region 414.

The heterojunction barrier regions 430 may be formed as stripe-shaped regions in the Schottky contact layer 418. However, the heterojunction barrier regions 430 may be formed in other shapes, such as islands, squares, dots, hexagons, or any other desired shape.

The heterojunction barrier regions 430 may be formed by ion implantation and/or diffusion doping. If diffusion doping is used, a silicon carbide JBS Schottky diode may be formed without using ion implantation at all.

The heterojunction barrier regions 430 may include polysilicon regions doped to have a conductivity that is opposite the conductivity type of the drift region 414, so that the heterojunction barrier regions 130 form P-N heterojunctions J7 with the drift region 414.

The heterojunction barrier regions 430 may be doped with p-type dopants, such as boron and/or aluminum, at a net dopant concentration of about $1 \times 10^{17}$ to about $5 \times 10^{20}$ cm$^{-3}$, and may have a height above the drift layer 414 of about 0.3 to about 0.5 µm. In particular embodiments, the heterojunction barrier regions 430 may be doped at a dopant concentration of about $5 \times 10^{18}$ cm$^{-3}$, and may extend to a height of about 0.3 µm above the surface of the drift layer 414.

A metal overlayer 419 may be formed on the Schottky contact layer 418. The metal overlayer 419 may comprise Ti, Al, and/or Ti/Al for example, and may provide an ohmic contact to the Schottky contact layer 418.

A cathode contact 420 is formed on a side of the substrate 412 opposite the drift layer 414 and/or directly on the drift layer 414. The cathode contact 420 may include a metal, such as nickel, that is capable of forming an ohmic contact to n-type silicon carbide.

As with previous embodiments, the Schottky junction J6 between the Schottky contact layer 418 and the drift layer 414 may turn on at a lower forward voltage than the P-N heterojunction J7 between the junction barrier regions 430 and the drift layer 414.

Figure 16:
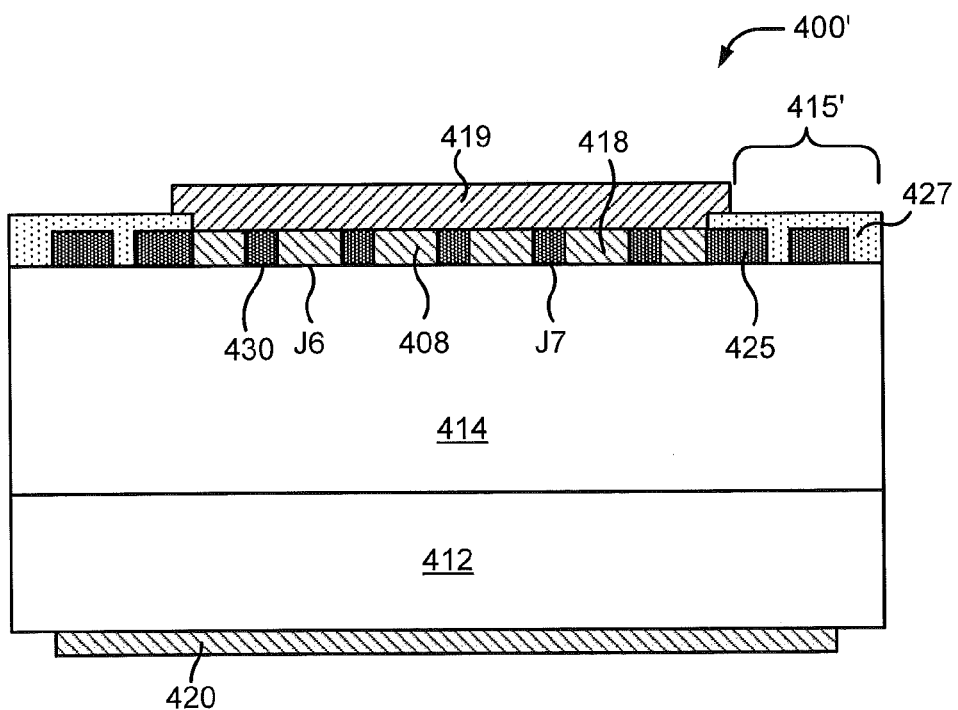

FIG. 16 illustrates a diode 400' that includes an edge termination region 415 surrounding the active region. The edge termination region 415 may include a junction termination extension (JTE) region, field rings, field plates, guard rings, and/or a combination of the foregoing or other terminations. In particular, the device 400' may include a plurality of guard rings 425, which may be formed of the same material as the heterojunction barrier regions 430 and may also be doped to have a conductivity opposite the conductivity type of the drift layer 414.

Figure 17:
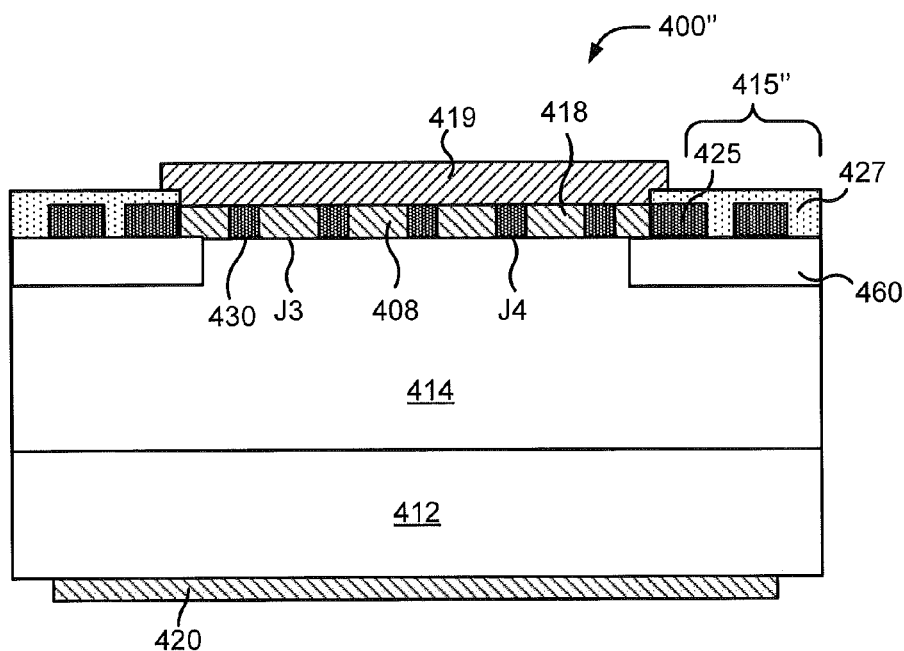

FIG. 17 illustrates a diode 400" in which the edge termination region 415 includes a shallow implanted region 460. The implanted region 460 may have a net concentration of dopants having a conductivity opposite the conductivity type of the drift region 114 of about $1 \times 10^{17}$ cm$^{-3}$.

The passivation layer 427 may cover the guard rings 425. The edge termination region 415 may include at least one floating guard ring 425 that is electrically isolated from the Schottky contact layer 418 under zero bias conditions.

Figure 18:
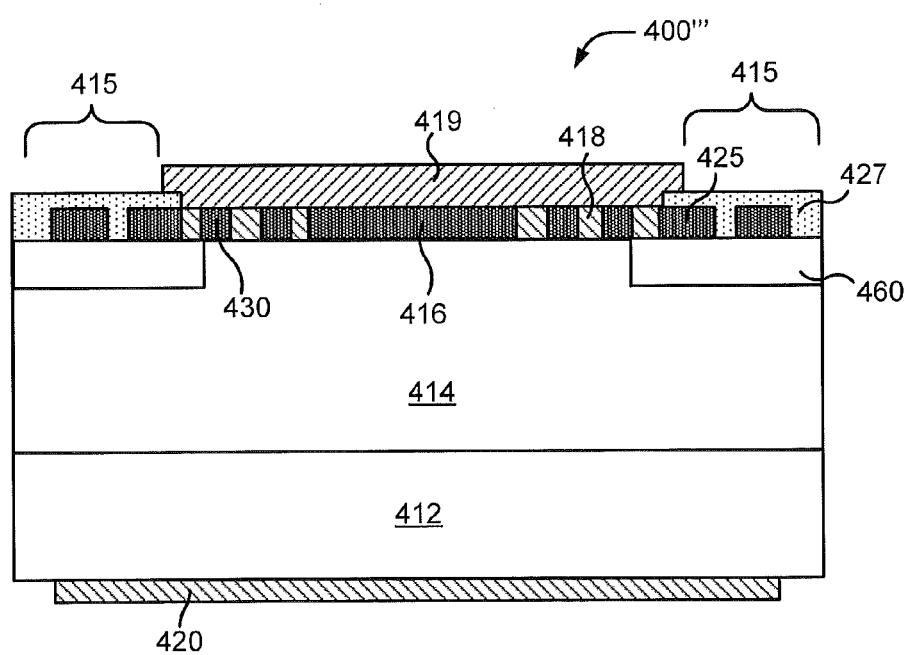

FIG. 18 illustrates a diode 400''' in which the edge termination region 415 includes a shallow implanted region 460 in addition to guard rings 425. The implanted region 460 has a conductivity type opposite the conductivity type of the drift layer 414. The implanted region 460 may have a net concentration of dopants having a conductivity opposite the conductivity type of the drift layer 414 of about $1 \times 10^{17}$ cm$^{-3}$.

As further illustrated in FIG. 18, one or more current surge pads 416 may also be provided on the drift layer 414. The current surge pads 416 may be formed of the same material as the heterojunction barrier regions 430. For example, the current surge pads 416 may be provided as polysilicon regions doped with p-type dopants, such as boron and/or aluminum, at a concentration of about $1 \times 10^{18}$ to about $1 \times 10^{20}$ cm$^{-3}$, and may extend to a height of about 0.3 to about 0.5 µabove the drift layer 114. In particular embodiments, the current surge pads 416 may be doped at a dopant concentration of about $5 \times 10^{18}$ cm$^{-3}$, and may extend to a height of about 0.3 µm above the drift layer 114. As in the embodiments above, the current surge pads 416 have a larger width than the heterojunction barrier regions 430 to encourage the flow of surge current through the current surge pads at high forward voltages. For example, the current surge pads 416 may have a width of about 10 μm to about 250 μm. In particular embodiments, the current surge pads 416 may have a width of about 20 μm.

In some embodiments, the current surge pads 416 and/or heterojunction barrier regions 430 may be formed of other types of materials that can be doped to have a conductivity that is opposite the conductivity of the drift layer 414 and can form a heterojunction with the drift layer 414. For example, when the drift region comprises n-type silicon carbide, a material such as p-type gallium nitride can be used to form the current surge pads 416 and/or heterojunction barrier regions 430.

Figure 19:
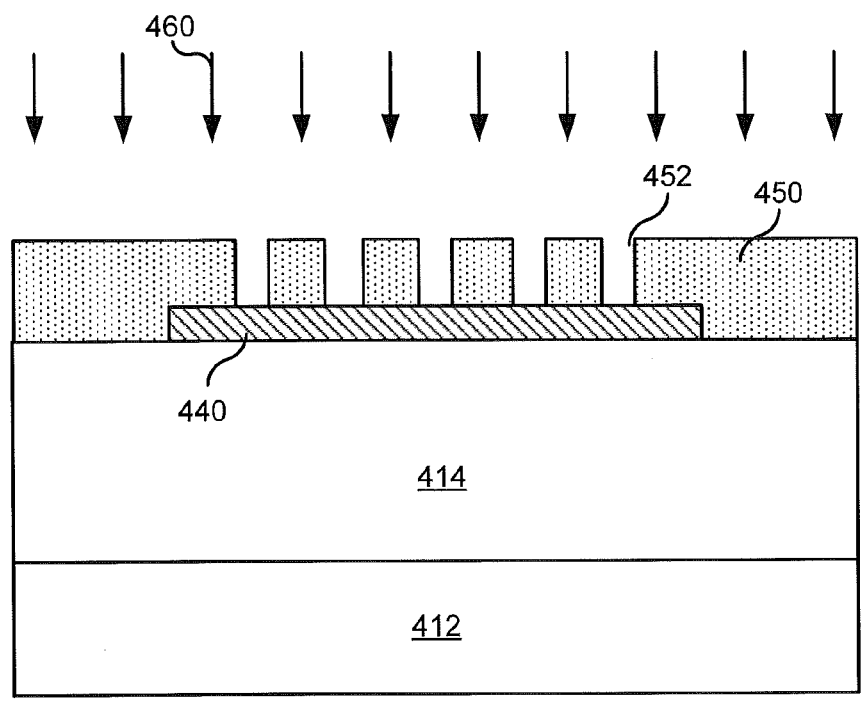
FIGS. 19-22 are cross-sectional views illustrating formation of JBS diodes according to embodiments of the present invention.
Figure 20:
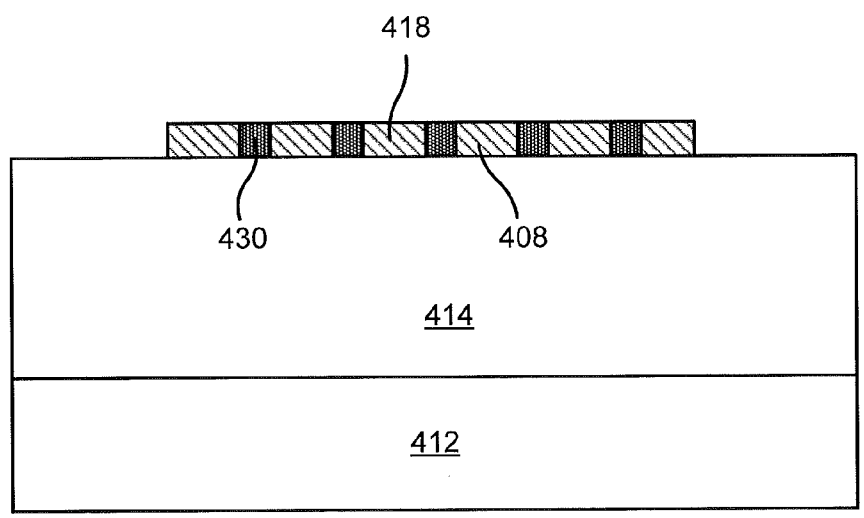

FIGS. 19 and 20 illustrate the formation of a diode 400 according to some embodiments. Referring to FIG. 19, a polysilicon layer is deposited on a surface of a drift layer 414 and patterned to form a preliminary Schottky contact layer 440. The preliminary Schottky contact layer 440 has a thickness of about 0.3 μm to about 0.5 μm, and is doped, for example by diffusion doping, with n-type conductivity dopants to have a dopant concentration of $1 \times 10^{15}$ cm$^{-3}$ to $5 \times 10^{19}$ cm$^{-3}$. The preliminary Schottky contact layer 440 may be doped during deposition and/or subsequent to deposition using spin-on coating and diffusion and/or ion implantation.

Next, an implant mask 450 is formed on the drift layer 414 and the preliminary Schottky contact layer 440 and pattern to expose selected portions of the preliminary Schottky contact layer 440 through gaps 452 in the doping mask 450.

The preliminary Schottky contact layer 440 is then selectively doped by implantation of p-type dopant ions 460 to form the heterojunction barrier regions 430 in the preliminary Schottky contact layer 440 and simultaneously define n-type Schottky contact regions 408 that contact the drift layer 414. The heterojunction barrier regions 430 may be doped with p-type dopants, such as boron and/or aluminum, to have a net dopant concentration of about $1 \times 10^{17}$ to about $1 \times 10^{20}$ cm$^{-3}$. The implanted dopants may be activated with a standard polysilicon activation anneal. It will be appreciated that diffusion doping could also be used to form the heterojunction barrier regions 430.

Referring to FIG. 20, the implant mask 450 is removed. Subsequently, and guard rings 425 as shown in FIG. 17 may be formed on the drift layer 414 outside the Schottky contact layer 418. The guard rings may be formed, for example, by deposition, patterning and doping of polysilicon.

Figure 21:
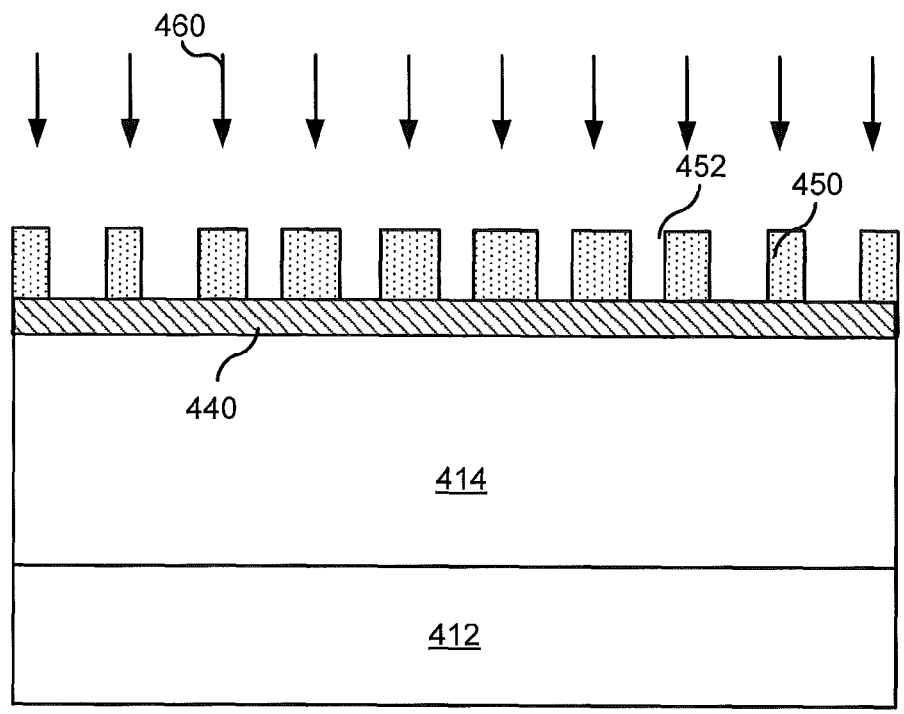
Figure 22:
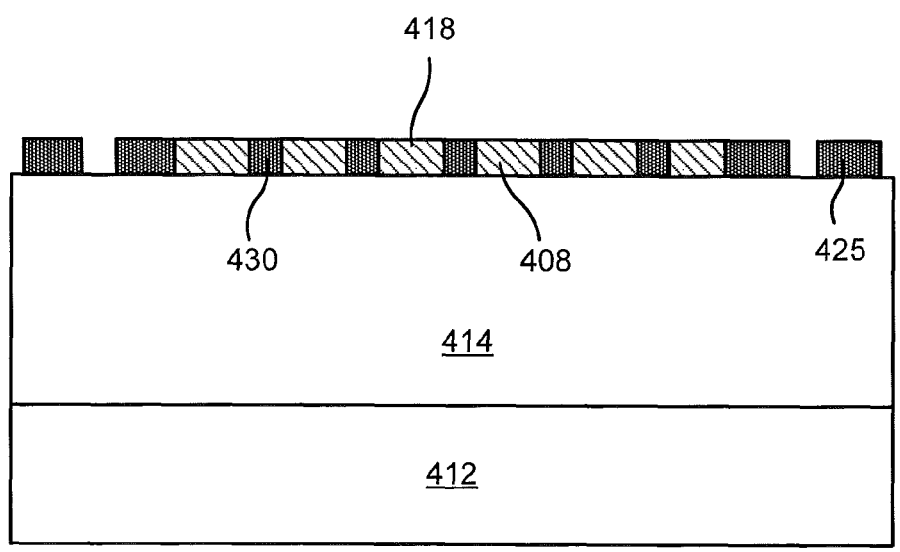

Alternatively, as shown in FIGS. 21 and 22, the guard rings 425 can be formed simultaneously with the heterojunction barrier regions 430 by appropriate patterning of the implant mask 450. After formation of the guard rings 425 and the heterojunction barrier regions 430, the preliminary Schottky contact layer 440 may be patterned to define the Schottky contact layer 418 and the guard rings 425.

In still further embodiments, implanted guard rings may be formed in the drift layer 414 outside the active region.

Embodiments of the present invention provide junction barrier Schottky semiconductor devices that may require no, or fewer, implantation steps compared to conventional JBS devices. Thus, cost and/or complexity of fabrication of such devices can be reduced. For example, annealing of p-type implants in silicon carbide may require anneal temperatures greater than 1600° C.

Furthermore, some embodiments use doped polysilicon features in a JBS diode. Polysilicon can be doped in many conventional techniques, and polysilicon processing techniques are compatible with high throughput processing that can be performed at lower temperatures and in less complicated and expensive equipment compared to silicon carbide. For example, annealing implanted polysilicon can be performed in a standard furnace at temperatures less than 1100° C. Furthermore, p-type polysilicon can act as a minority injector in surge current conditions in some embodiments, and the surge capability may be further enhanced at high temperature operation.

While embodiments of the present invention have been described with reference to particular sequences of operations, as will be appreciated by those of skill in the art, certain operations within the sequence may be reordered while still benefiting from the teachings of the present invention. Accordingly, the present invention should not be construed as limited to the exact sequence of operations described herein.

Many different embodiments have been disclosed herein, in connection with the above description and the drawings. It will be understood that it would be unduly repetitious and obfuscating to literally describe and illustrate every combination and subcombination of these embodiments. Accordingly, all embodiments can be combined in any way and/or combination, and the present specification, including the drawings, shall be construed to constitute a complete written description of all combinations and subcombinations of the embodiments described herein, and of the manner and process of making and using them, and shall support claims to any such combination or subcombination.

In the drawings and specification, there have been disclosed typical embodiments and, although specific terms are employed, they are used in a generic and descriptive sense only and not for purposes of limitation, the scope of the inventive concepts being set forth in the following claims.

That which is claimed is:

1. An electronic device comprising:
   a silicon carbide layer including an n-type drift region therein;
   a contact forming a Schottky junction with the drift region; and
   a p-type junction barrier region on the silicon carbide layer;
   wherein the p-type junction barrier region comprises a p-type polysilicon region forming a P-N heterojunction with the drift region;
   wherein the p-type junction barrier region is electrically connected to the contact;
   the electronic device further comprising:
   a plurality of guard rings at a surface of the silicon carbide layer laterally adjacent to the contact, wherein the plurality of guard rings comprise a plurality of second p-type polysilicon regions on the drift region, the second p-type polysilicon regions being electrically isolated from the contact under zero bias conditions; and
   a junction termination region at the surface of the silicon carbide layer having a conductivity type opposite the conductivity type of the drift region;
   wherein the plurality of second p-type polysilicon regions contact the junction termination region.

2. The electronic device of claim 1, wherein the Schottky junction between the contact and the drift region is configured to turn on at a lower forward voltage than the P-N heterojunction between the junction barrier region and the drift region.

3. The electronic device of claim 1, wherein the contact forms an ohmic contact to the p-type polysilicon region; and wherein the P-N heterojunction between the p-type junction barrier region and the drift region is configured to begin to conduct majority carriers at a higher forward voltage than a turn on voltage of the Schottky junction.

4. An electronic device comprising
a silicon carbide layer including an n-type drift region therein;
a contact forming a Schottky junction with the drift region; and
p-type junction barrier region on the silicon carbide layer;
wherein the p-type junction barrier region comprises a p-type polysilicon region forming a P-N heterojunction with the drift region; and
wherein the p-type junction barrier region is electrically connected to the contact;
the electronic device further comprising:
a guard ring termination region at a surface of the silicon carbide layer laterally adjacent to the contact, wherein the guard ring termination region comprises a second p-type polysilicon region on the drift region, the second p-type polysilicon region being electrically isolated from the contact under zero bias conditions and forming a p-n heterojunction with the drift region.

5. The electronic device of claim 1, wherein the junction barrier region comprises a plurality of p-type polysilicon regions in the drift region and a p-type polysilicon minority injector pad in the drift region beneath the contact and electrically connected to the contact.

6. The electronic device of claim 5, wherein the minority injector pad has a surface area in a horizontal plane parallel to a major surface of the silicon carbide layer that is larger than a surface area in the horizontal plane of one of the plurality of p-type polysilicon regions in the junction barrier region.

7. The electronic device of claim 5, wherein the minority carrier injector pad has a surface area in a horizontal plane parallel, to a major surface of the silicon carbide layer that is at least about 10% of a surface area of the drift region in the horizontal plane below the contact.

8. The electronic device of claim 1, farther comprising:
an n+ silicon carbide contact layer on the drift region opposite the contact; and a second contact on the contact layer.

9. An electronic device comprising:
a drift region having a first conductivity type;
a contact forming a metal-semiconductor junction with the drift region; and
a junction barrier region on the drift region;
a guard ring termination region on the drift region and laterally adjacent to the metal-semiconductor junction;
wherein the junction barrier region has a second conductivity type opposite the first conductivity type and comprises a heterojunction barrier region on the drift region;
wherein the heterojunction barrier region forms a P-N heterojunction with the drift region and is in electrical contact with the contact;
wherein the drill region comprises n-type silicon carbide and the heterojunction barrier region comprises p-type gallium nitride; and
wherein the guard ring termination region comprises a second heterojunction barrier region.

10. The electronic device of claim 9, wherein the metal-semiconductor junction between the contact and the drift region is configured to turn on at a lower forward voltage than the P-N heterojunction between the heterojunction barrier region and the drill region.

11. The electronic device of claim 9, wherein the contact forms an ohmic contact to the heterojunction harrier region; and
wherein the P-N heterojunction between the heterojunction barrier region and the drill region is configured to begin to conduct majority carriers at a higher forward voltage than a turn on voltage of the metal-semiconductor junction and at a lower voltage at which the P-N heterojunction between the heterojunction barrier region and the drift region begins to inject minority carriers into the drift region.

12. The electronic device of claim 9, wherein the heterojunction barrier region comprises a plurality of p-type gallium nitride regions on the drift region and at least one p-type gallium nitride minority injector pad on the drift region beneath the contact and electrically connected to the contact.

13. The electronic device of claim 12, wherein the minority carrier injection pad has a width that is greater than a width of the junction barrier region.

14. The electronic device of claim 12, wherein the minority injector pad has a horizontal surface area that is larger than a horizontal surface area of one of the plurality of p-type gallium nitride regions in the junction barrier region.

15. The electronic device of claim 9, further comprising:
a termination region at a surface of the drift region and defining an active region of the device within the termination region;
wherein a ratio of a surface area of the active region occupied by the heterojunction barrier regions to a total surface area of the active region is about 2% to about 40%.

16. The electronic device of claim 15, wherein the ratio of the surface area of the active region occupied by the heterojunction barrier regions to the total surface area of the active region is about 4% to about 30%.

17. The electronic device of claim 15, wherein the ratio of the surface area of the active region occupied by the heterojunction barrier regions to the total surface area of the active region is about 10% to about 30%.

18. The electronic device of claim 15, wherein the ratio of the surface area of the active region occupied by the heterojunction barrier regions to the total surface area of the active region is about 20% to about 30%.

19. An electronic device comprising:
a silicon carbide layer comprising a drift region having a first conductivity type;
a contact on a surface of the drift region and forming a Schottky junction with the drift region; and
a guard ring in contact with the surface of the silicon carbide layer adjacent to the Schottky junction;
wherein the guard ring has a conductivity type opposite the conductivity type of the drift region and comprises a material that forms a hetero junction with the drift region; and
wherein the guard ring comprises polysilicon and/or gallium nitride.

20. An electronic device comprising:
a drift region, having a first conductivity type;
a contact forming a metal-semiconductor junction with the drift region; and
a guard ring on the drift region and laterally adjacent to the metal-semiconductor junction, the guard ring having a second conductivity type opposite the first conductivity type;

wherein the guard ring comprises a semiconductor material that forms a P-N heterojunction with the drift region.

21. The electronic device of claim 20, wherein the guard ring comprises doped polysilicon.

22. The electronic device of claim 20, further comprising;
a junction barrier region having the second conductivity type on the drift region;
wherein the junction barrier region comprises a heterojunction barrier region on the drift region; and wherein the heterojunction barrier region forms a P-N heterojunction with the drift region and is in electrical contact with the contact.

23. The electronic device of claim 22, wherein the metal-semiconductor junction between the contact and the drift region is configured to turn on at a lower forward voltage than the P-N heterojunction between the heterojunction barrier region and the drift region.

24. The electronic device of claim 22, wherein the contact forms an ohmic contact to the heterojunction barrier region; and
wherein the P-N heterojunction between the heterojunction barrier region and the drift region is configured to begin to conduct majority carriers at a higher forward voltage than a turn on voltage of the metal-semiconductor junction and at a lower voltage at which the P-N heterojunction between the heterojunction barrier region and the drift region begins to inject minority carriers into the drift region.

25. The electronic device of claim 22, wherein the heterojunction barrier region comprises a plurality of p-type polysilicon regions on the drift region and at least one type polysilicon polysilicon minority injector pad on the drift region beneath the contact and electrically connected to the contact.

* * * * *

UNITED STATES PATENT AND TRADEMARK OFFICE
CERTIFICATE OF CORRECTION

| | | |
|---|---|---|
| PATENT NO. | : 9,466,674 B2 | Page 1 of 1 |
| APPLICATION NO. | : 13/605324 | |
| DATED | : October 11, 2016 | |
| INVENTOR(S) | : Allen et al. | |

It is certified that error appears in the above-identified patent and that said Letters Patent is hereby corrected as shown below:

In the Specification
Column 14, Line 63: Please correct "µabove" to read -- µm above --

In the Claims
Column 17, Claim 3, Line 2: Please correct "harrier" to read -- barrier --
Column 17, Claim 4, Line 5: Please correct "comprising" to read -- comprising: --
Column 17, Claim 7, Line 37: Please correct "parallel," to read -- parallel --
Column 17, Claim 8, Line 40: Please correct "farther comprising;" to read -- further comprising: --
Column 17, Claim 9, Line 58: Please correct "drill" to read -- drift --
Column 18, Claim 11, Line 2: Please correct "harrier" to read -- barrier --
Column 18, Claim 19, Line 56: Please correct "hetero junction" to read -- heterojunction --
Column 18, Claim 20, Line 61: Please correct "region," to read -- region --
Column 20, Claim 25, Lines 14 and 15: Please correct "type polysilicon polysilicon" to read -- p-type polysilicon --

Signed and Sealed this
Second Day of May, 2017

Michelle K. Lee
*Director of the United States Patent and Trademark Office*